US008426738B2

United States Patent
Shin et al.

(10) Patent No.: US 8,426,738 B2
(45) Date of Patent: Apr. 23, 2013

(54) FLEXIBLE PCB OF SPINDLE MOTOR

(75) Inventors: Jun Sup Shin, Gyunggi-do (KR); Bum Cho Kim, Seoul (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 465 days.

(21) Appl. No.: 12/692,422

(22) Filed: Jan. 22, 2010

(65) Prior Publication Data
US 2011/0127071 A1 Jun. 2, 2011

(30) Foreign Application Priority Data

Nov. 30, 2009 (KR) .................. 10-2009-0116956

(51) Int. Cl.
*H05K 1/02* (2006.01)
(52) U.S. Cl.
USPC ............. 174/254; 174/50; 174/539; 361/827; 361/826; 361/714; 361/724; 360/264.2; 360/266.3
(58) Field of Classification Search ................... 361/149; 174/254
See application file for complete search history.

(56) References Cited

U.S. PATENT DOCUMENTS

| 4,121,044 A * | 10/1978 | Hadersbeck et al. ......... 174/254 |
| 6,486,410 B1 * | 11/2002 | Johansson et al. ............ 174/254 |
| 2006/0138886 A1 * | 6/2006 | Ito et al. ......................... 310/89 |

FOREIGN PATENT DOCUMENTS

KR    2005000298    *    1/2005

* cited by examiner

*Primary Examiner* — Tuan T Dinh
*Assistant Examiner* — Mukund G Patel
(74) *Attorney, Agent, or Firm* — Blakely Sokoloff Taylor & Zafman LLP

(57) ABSTRACT

Disclosed herein is a flexible printed circuit board (PCB) of a spindle motor. The flexible PCB includes a solder part, an upper reinforcing plate, a lower reinforcing plate, and a soldering part. The solder part has a through hole so that a coil extending from a stator core passes through the solder part, and has a separation part which is open or closed only in one direction along with the through hole. The upper reinforcing plate supports the upper portion of the separation part. The lower reinforcing plate supports the lower portion of the solder part, and has an elliptical through hole which partially overlaps with the through hole so that the coil passes through the lower reinforcing plate. The soldering part is formed to enable the coil to be secured to the solder part.

5 Claims, 5 Drawing Sheets

100  140    160  150

FLEXIBLE PCB OF SPINDLE MOTOR

CROSS REFERENCE TO RELATED APPLICATION

This application claims the benefit of Korean Patent Application No. 10-2009-0116956, filed on Nov. 30, 2009, entitled "Flexible PCB of Spindle Motor", which is hereby incorporated by reference in its entirety into this application.

BACKGROUND OF THE INVENTION

1. Technical Field

The present invention relates to a flexible printed circuit board (PCB) of a spindle motor.

2. Description of the Related Art

In a data recording and reproducing device such as a hard disk drive (HDD), a through hole is formed in a base of a spindle motor, a coil of a rotary drive unit installed in the spindle motor is pulled through the through hole to the outside of the spindle motor, and the coil is connected to a drive circuit which is installed to the outside of the spindle motor to rotatably drive the spindle motor.

In the base having a bearing part which rotatably supports a hub on which a magnetic disk or the like is placed, a flexible PCB is attached to the outside of the through hole formed in the base, and the coil extends from the inside of the spindle motor to the outside thereof through the through hole and is welded to the flexible PCB.

According to the related art, in order to couple a stator with the PCB, the coil and the stator are coupled to each other through the through hole. The remaining part of the through hole, which is not used to couple the coil with the stator, is sealed using a UV adhesive to prevent the inflow of ambient air, in addition to preventing the ingress of impurities.

As such, after the UV adhesive has been applied, the UV adhesive is cured and a thermal curing process is performed, thus increasing the working time and the proportion of defectives resulting from the process.

Therefore, research into a device which can minimize the problems caused by the UV bonding process and more efficiently perform a work process is pressing.

SUMMARY OF THE INVENTION

The present invention has been made in an effort to provide a flexible PCB of a spindle motor, which simplifies a bonding process, increases productive efficiency and reduces a proportion of defectives.

In a flexible PCB of a spindle motor according to an embodiment of the present invention, a solder part has a through hole so that a coil extending from a stator core passes through the solder part, and has a separation part which is open or closed only in one direction along with the through hole. An upper reinforcing plate supports the upper portion of the separation part. A lower reinforcing plate supports the lower portion of the solder part, and has an elliptical through hole which partially overlaps with the through hole so that the coil passes through the lower reinforcing plate. A soldering part is formed to enable the coil to be secured to the solder part.

The solder part may have a shape of a valve so that the coil extending downwards from the stator core passes through the solder part while opening the separation part downwards.

A width of the upper reinforcing plate may correspond to a width of the separation part.

The through hole may be formed an end of the separation part.

Further, a shape of the through hole may not be equal to that of the elliptical through hole, and the through hole may partially overlap with the elliptical through hole.

Further, a center of the soldering part may be different from a center of the solder part.

Various objects, advantages and features of the invention will become apparent from the following description of embodiments with reference to the accompanying drawings.

The terms and words used in the present specification and claims should not be interpreted as being limited to typical meanings or dictionary definitions, but should be to interpreted as having meanings and concepts relevant to the technical scope of the present invention based on the rule according to which an inventor can appropriately define the concept of the term to describe most appropriately the best method he or she knows for carrying out the invention.

A flexible PCB of a spindle motor according to the present invention is advantageous because it is constructed so that an upper reinforcing plate and a lower reinforcing plate are mounted to a solder part having a valve structure, a coil passes through a through hole and an elliptical through hole formed in the solder part and thereafter soldering is performed, thus it is not necessary to perform the UV bonding process.

As a result, the solder part of the valve structure can minimize the size of the through hole, in addition to improving workability. Further, the UV bonding process can be omitted, so that the amount produced and productive efficiency can be increased.

DESCRIPTION OF THE PREFERRED EMBODIMENTS

Figure 1:
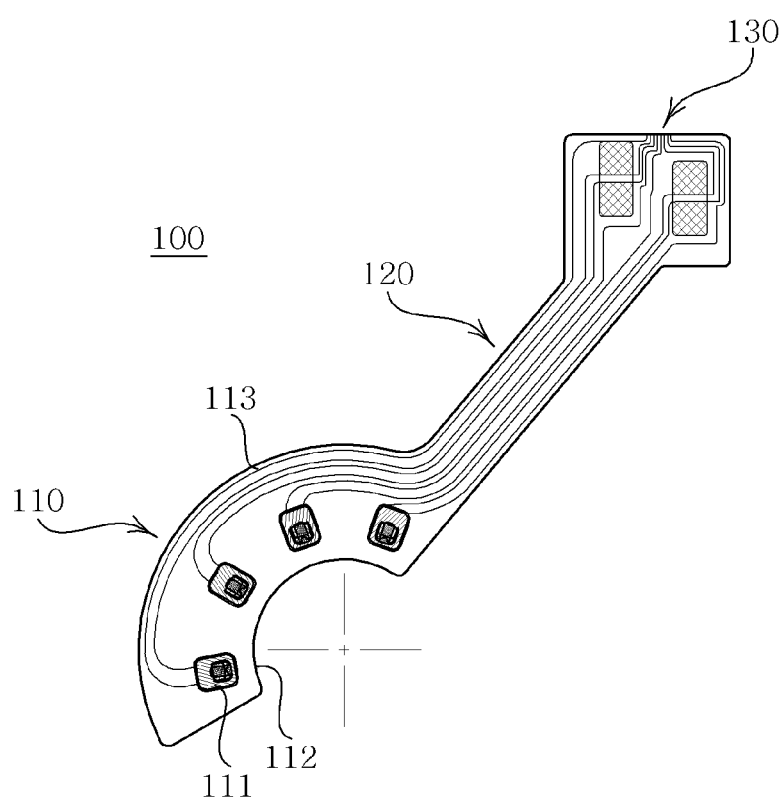
FIG. 1 is a view illustrating a flexible PCB of a spindle motor according to the present invention.

The above and other objects, features and advantages of the present invention will be more clearly understood from the following detailed description taken in conjunction with the accompanying drawings. Herein, the same reference numerals are used throughout the different drawings to designate the same components. Further, when it is determined that the detailed description of the known art related to the present invention may obscure the gist of the present invention, the detailed description will be omitted.

Figure 2:
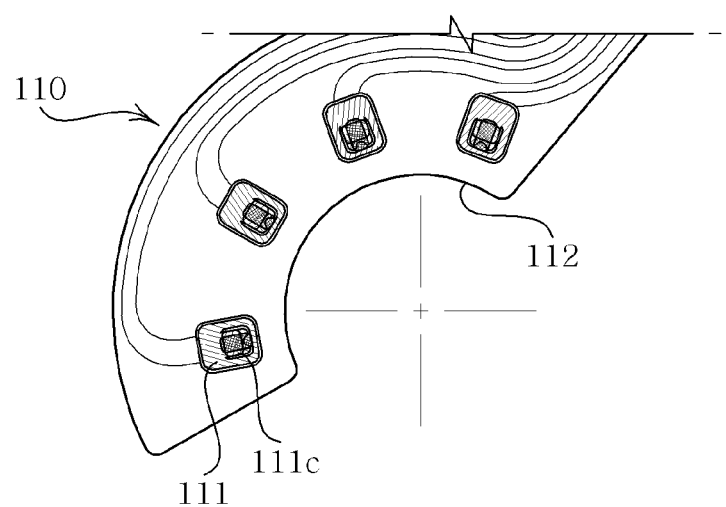
FIG. 2 is an enlarged view illustrating a connection part of the flexible PCB according to the present invention.
Figure 3:
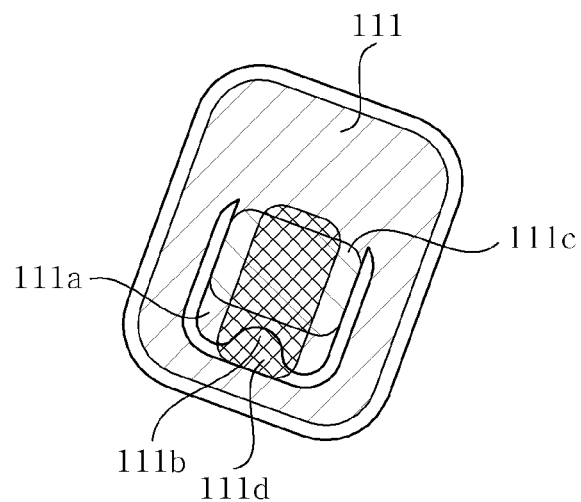
FIG. 3 is a top view illustrating a solder part of the flexible PCB according to the present invention.
Figure 4:
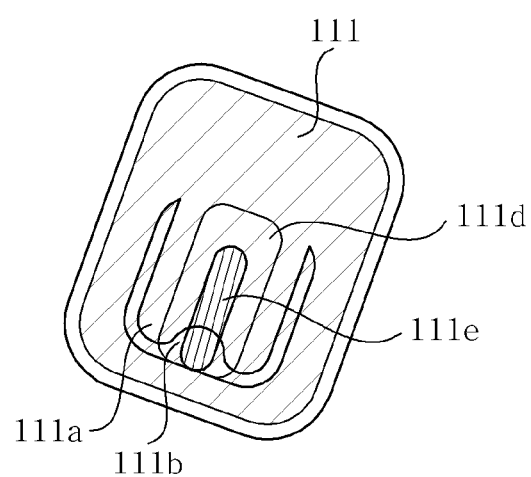
FIG. 4 is a bottom view illustrating the solder part of the flexible PCB according to the present invention.
Figure 5:
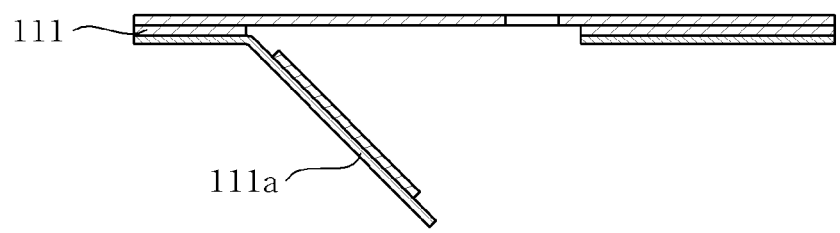
FIG. 5 is an enlarged side view illustrating the valve-shaped solder part of the flexible PCB according to the present invention.
Figure 6:
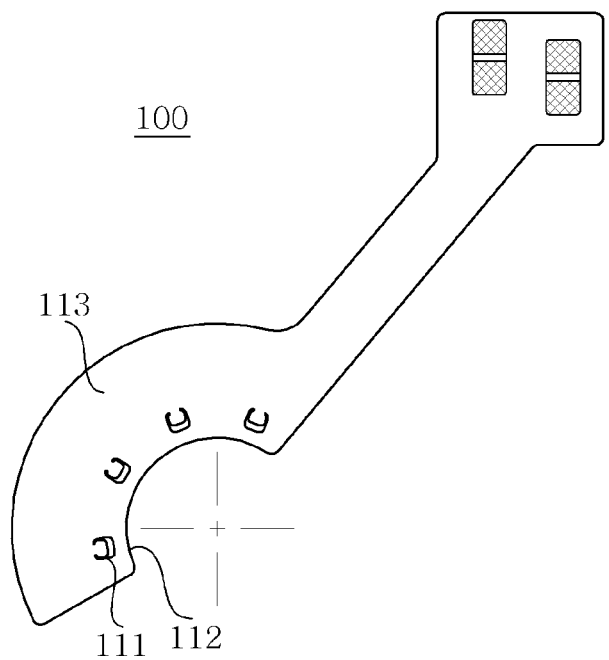
FIG. 6 is a view illustrating the state in which an upper reinforcing plate is not attached to the flexible PCB according to the present invention.
Figure 7:
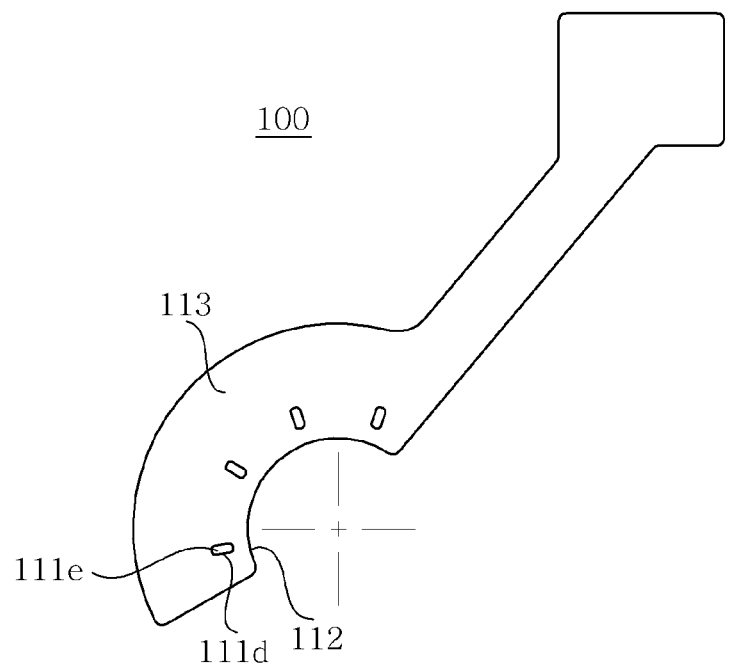
FIG. 7 is a bottom view illustrating the flexible PCB according to the present invention.
Figure 8:
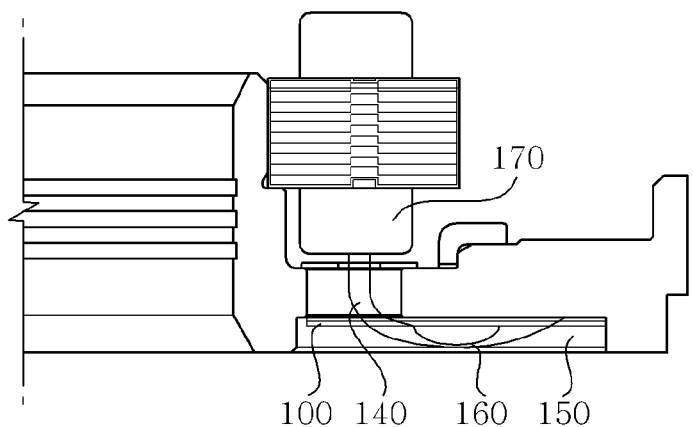
FIG. 8 is a side view illustrating the state in which a coil is connected to the spindle motor according to the present invention.
Figure 9:
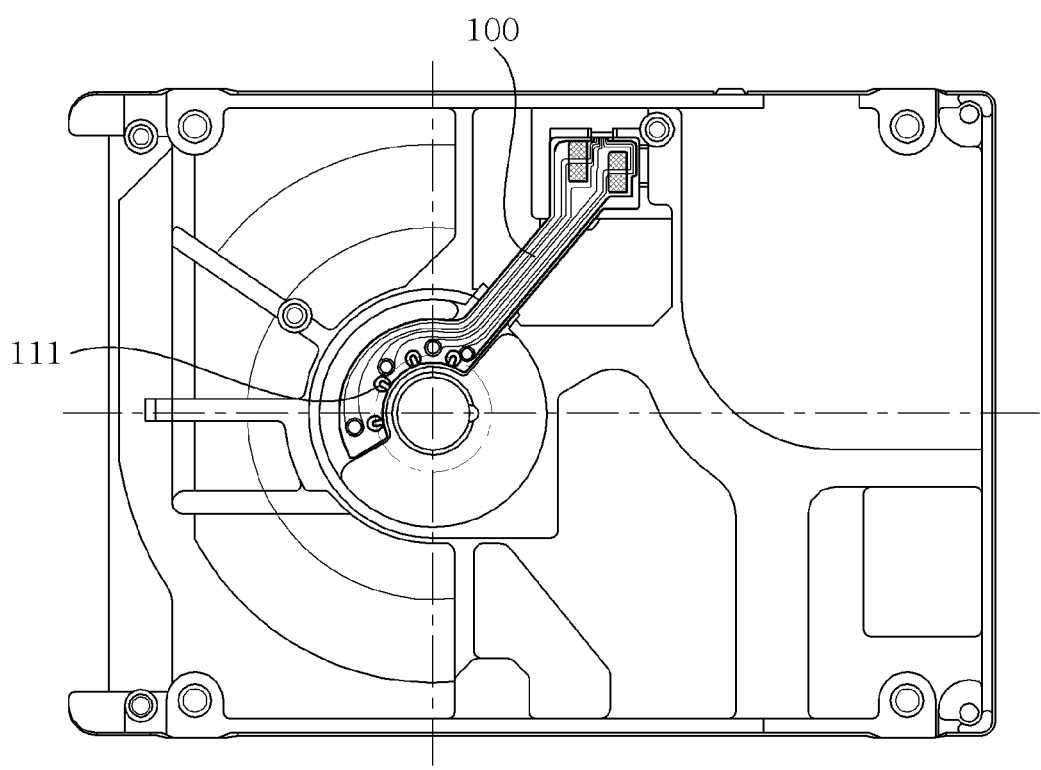
FIG. 9 is a view illustrating the state in which the spindle motor is provided in a hard disk drive.

FIG. 1 is a view illustrating a flexible PCB 100 of a spindle motor according to the present invention, FIG. 2 is an enlarged view illustrating a connection part of the flexible PCB 100, FIG. 3 is a top view illustrating a solder part 111 of the flexible PCB 100, and FIG. 4 is a bottom view illustrating the solder part 111. Further, FIG. 5 is an enlarged side view illustrating the state in which the upper portion of the valve-shaped solder part 111 faces downwards, FIG. 6 is a view illustrating the state in which an upper reinforcing plate 111c is not attached to the flexible PCB 100, and FIG. 7 is a bottom view illustrating the flexible PCB. Further, FIG. 8 is a side view illustrating the state in which the flexible PCB 100 is connected to the spindle motor through a coil 140, and FIG. 9 is a view illustrating to the state in which the spindle motor is provided in a hard disk drive. Hereinafter, the spindle motor according to the preferred embodiment of the present invention will be described in detail with reference to the accompanying drawings.

As shown in FIG. 1, the flexible PCB 100 of the spindle motor according to the preferred embodiment of the present invention serves as an interface in the spindle motor which pursues miniaturization, lightness, and thinness, and efficiently contributes to the miniaturization of a magnetic disk device. The flexible PCB 100 is electrically connected to the spindle motor through the coil extending from a stator core.

The flexible PCB 100 includes a plurality of wires (not shown) to electrically connect an electric part to the PCB, has a multi-layer structure and includes a bending part which may be flexibly deformed.

The flexible PCB 100 includes a connection part 110 having one or more solder parts 111 to which the coil is electrically connected, a coupling part 120 which couples the connection part 110 to a power source, and a power supply part 130 which is coupled to the power source.

The coil is made of a copper material and extends from the stator core (not shown). The coil prevents electric current from suddenly increasing or dropping off, and is inexpensive and has low resistance, thus minimizing electric loss.

Each solder part 111 is a part which joins the coil and the flexible PCB 100 with solder to electrically connect the coil and the flexible PCB 100. One or more solder parts 111 are provided to be adjacent to the inner circumferential part 112 of the flexible PCB 130 and positioned at the same radial distance from the center.

The connection part 110 of the flexible PCB 100 includes the inner circumferential part 112 having a first curvature which forms an inner circumference, and an outer circumferential part 113 having a second curvature which forms an outer circumference.

As shown in FIG. 2, the solder parts 111 are formed at regular intervals on the to connection part 110 of the flexible PCB 100. Only a portion of each solder part 111 is integrally coupled to the connection part 110, and a remaining portion is separated from the connection part 110, thus providing a valve structure. An upper reinforcing plate 111c is provided on the upper portion of the solder part 111. The upper reinforcing plate 111c is provided above each solder part 111 to laterally support it.

FIG. 2 is illustrated to aid the convenient description of the present invention. When the flexible PCB 100 is actually mounted to the spindle motor, the part shown in FIG. 2 faces downwards. Thus, the coil extending downwards from the stator core 170 opens the valve-shaped solder part 111 only in one direction and simultaneously passes through the solder part 111.

FIG. 3 is an enlarged view illustrating the solder part 111 of FIG. 2. The solder part 111 has a valve structure which is separated at a predetermined portion thereof and bent only in one direction. The solder part 111 includes a separation part 111a which is partially separated from the solder part 111 in such a way as to be bent, and a through hole 111b which is formed at an end of the separation part 111a and positioned at a junction of the separation part 111a and the solder part 111 such that the coil passes through the through hole 111b.

The upper reinforcing plate 111c is provided on the upper portion of the solder part 111 to laterally support the upper portion of the separation part 111a. The width of the upper reinforcing plate 111c corresponds to that of the separation part 111a to support the separation part 111a.

FIG. 4 is a bottom view illustrating the solder part 111. A lower reinforcing plate 111d is mounted to the lower portion of the separation part 111a of the solder part 111 to support the lower portion of the separation part 111a. An elliptical through hole 111e is formed in the central portion of the lower reinforcing plate 111d in such a way as to overlap the through hole 111b. The coil passes through the through hole 111b and the elliptical through hole 111e.

FIG. 5 is a side view of the solder part 111, when the solder part 111 is actually mounted to the spindle motor. As shown in the drawing, since the solder part 111 has the valve structure, it may open only in one direction (the downward direction).

Thus, the base (not shown) and insulating sheet (not shown) of the spindle motor or the coil passing through the base pushes the separation part 111a of the valve structure. After the coil passes through the through hole 111b, the coil is arranged and the separation part 111a is closed.

Thereafter, the separation part 111a and the solder part 111 are welded and joined by solder, thus sealing a space between the separation part 111a and the solder part 111 and preventing the inflow of ambient air.

FIG. 6 is a top view illustrating the flexible PCB 100 of the spindle motor according to the present invention, in which the solder part 111 has the structure of a valve which is open only in one direction. Here, three or more solder parts 111 are formed at regular intervals to be adjacent to the inner circumferential part 112.

FIG. 7 is a bottom view illustrating the flexible PCB 100 of the spindle motor according to the present invention. The lower reinforcing plate 111d having in its central portion the elliptical through hole 111e is mounted to the lower portion of the solder part 111.

FIG. 8 is a side view illustrating the flexible PCB 100 mounted to the spindle motor according to the present invention. Referring to the drawing, the flexible PCB 100 is mounted on a base plate 150, and the coil 140 extending from the stator core 170 passes through the flexible PCB 100.

Here, the valve-shaped separation part 111a of the flexible PCB 100 is mounted to face downwards. The coil 140 extending from the stator core 170 passes through the through hole 111b and the elliptical through hole 111e and is secured to the lower portion to of the flexible PCB 100. Since the separation part 111a opens only downwards, the upward movement of the coil 140 passing through the through hole 111b and the elliptical through hole 111e is prevented.

The shape of the through hole 111b is not equal to that of the elliptical through hole 111e, and the through hole 111b partially overlaps with the elliptical through hole 111e. After the passage of the coil, a soldering part 160 is formed between the flexible PCB 100 and the coil 140 using solder such as lead, thus sealing a space between the flexible PCB 100 and the coil 140.

The soldering part 160 obviates the necessity of the UV bonding process which is relatively expensive, thus preventing the occurrence of defective application, non-cured portions, and defective portions when examined with the naked eye, which may result from the UV bonding process. Here, the center of the soldering part 160 is not equal to that of the solder part 111.

FIG. 9 is a top plan view illustrating the state in which the flexible PCB 100 of the spindle motor according to the present invention is installed in a hard disk drive.

As described above, the flexible PCB 100 of the spindle motor according to the present invention is constructed so that the upper reinforcing plate 111c and the lower reinforcing plate 111d are mounted to the solder part 111 having the valve structure, the coil 140 passes through the through hole 111b and the elliptical through hole 111e formed in the solder part 111 and thereafter soldering is performed, thus it is not necessary to perform the UV bonding process.

Therefore, the solder part 111 of the valve structure can minimize the size of the through hole 111b, in addition to improving workability. Further, the UV bonding process can be omitted, so that the amount produced and productive efficiency can be increased.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A flexible printed circuit board (PCB) of a spindle motor, comprising:
    a solder part having a through hole, formed for a coil extending from a stator core to pass through the through hole of the solder part, and having a separation part which is partially separated from the solder part by way of a hinge;
    an upper reinforcing plate supporting an upper portion of the separation part;
    a lower reinforcing plate mounted to a lower portion of the solder part, and having an elliptical through hole which partially overlaps with the through hole and formed for the coil that passes through the lower reinforcing plate; and
    a soldering part formed to enable the coil to be secured to the solder part.

2. The flexible PCB as set forth in claim 1, wherein the solder part has a shape of a valve formed for the coil extending downwards from the stator core passes through the solder part while opening the separation part downwards.

3. The flexible PCB as set forth in claim 1, wherein a width of the upper reinforcing plate corresponds to a width of the separation part.

4. The flexible PCB as set forth in claim 1, wherein the through hole is formed at an end of the separation part.

5. The flexible PCB as set forth in claim 1, wherein a shape of the through hole is not equal to that of the elliptical through hole, and the through hole partially overlaps with the elliptical through hole.

* * * * *